(12) United States Patent
Umayahara et al.

(10) Patent No.: US 6,649,550 B2
(45) Date of Patent: Nov. 18, 2003

(54) GLASS CERAMICS DIELECTRIC MATERIAL AND SINTERED GLASS CERAMICS

(75) Inventors: Yoshio Umayahara, Shiga (JP); Yoshikatsu Nishikawa, Shiga (JP)

(73) Assignee: Nippon Electric Glass Co., Ltd., Shiga (JP)

(*) Notice: Subject to any disclaimer, the term of this patent is extended or adjusted under 35 U.S.C. 154(b) by 0 days.

(21) Appl. No.: 09/988,023

(22) Filed: Nov. 16, 2001

(65) Prior Publication Data

US 2002/0091058 A1 Jul. 11, 2002

(30) Foreign Application Priority Data

Nov. 17, 2000 (JP) ........................................ 2000-351485

(51) Int. Cl.$^7$ .............................................. C03C 10/04
(52) U.S. Cl. .......................................... 501/5; 428/210
(58) Field of Search ........................ 501/5, 32; 428/210

(56) References Cited

U.S. PATENT DOCUMENTS 4,714,687 A * 12/1987 Holleran et al. ............... 501/9
4,853,349 A * 8/1989 Martin ........................... 501/8
6,232,251 B1 * 5/2001 Terashi et al. .................. 501/5
6,413,620 B1 * 7/2002 Kimura et al. ............... 428/210

FOREIGN PATENT DOCUMENTS

| JP | P2001-86288 | 3/2000 |
| JP | P2001-163683 | 6/2001 |

* cited by examiner

*Primary Examiner*—Karl Group
(74) *Attorney, Agent, or Firm*—Nixon & Vanderhye P.C.

(57) ABSTRACT

The present invention provides a glass ceramics dielectric material, comprising: a crystallizable glass powder in an amount of from 40% to 100% by mass; and a ceramics powder in an amount of from 0% to 60% by mass, wherein the crystallizable glass powder comprises: $SiO_2$ in an amount of from 35% to 65% by mass; CaO in an amount of from 10% to 30% by mass; MgO in an amount of from 10% to 20% by mass; and ZnO in an amount of from 0.5% to 35% by mass, and wherein the material is capable of forming: diopside, $CaMgSi_2O_6$, as crystals; and at least one of hardestnite, $Ca_2ZnSiO_7$, and willemite, $Zn_2SiO_4$, as crystals; and a sintered glass ceramics, comprising: diopside, $CaMgSi_2O_6$, as crystals; and at least one of hardestnite, $Ca_2ZnSiO_7$, and willemite, $Zn_2SiO_4$, as crystals.

2 Claims, No Drawings

GLASS CERAMICS DIELECTRIC MATERIAL AND SINTERED GLASS CERAMICS

FIELD OF THE INVENTION

The present invention relates to a glass ceramics dielectric material which has a low dielectric loss at a high frequency of 0.1 GHz or higher and is suitable for a microwave circuit component material, and a sintering product thereof.

BACKGROUND OF THE INVENTION

Alumina ceramics and glass ceramics made of glass powder and ceramics powder are known as dielectric materials for ceramics multi-layer substrates on which IC, LSI and the like are mounted at a high density. In particular, since glass ceramics can be fired at a temperature of 1,000° C. or lower it can be co-fired along with a low melting metallic material having a low resistivity such as Ag, Cu and the like, making it possible to use such a metallic material as an inner conductor to advantage.

Recently, in the field of communications such as mobile communications device (e.g., automobile telephone, personal wireless communication), satellite broadcasting, satellite communication, CATV and the like, a high frequency of 0.1 GHz or higher is used as a frequency band. Multi-layer substrates for use in communication in these high frequency bands are required to have a low dielectric loss at a high frequency of 0.1 GHz or higher. To this end, a glass ceramics dielectric material which forms diopside as main crystals has been developed.

The glass ceramics dielectric material which forms diopside as main crystals has a low dielectric loss of $10 \times 10^{-4}$ or lower at a high frequency range and can be fired at a temperature of 1,000° C. or lower. However, when fired, the glass ceramics dielectric material has a high shrinkage starting temperature. Therefore, when co-fired along with a silver conductor, the glass ceramics dielectric material shows some difference in shrinkage from the silver conductor so that there is a defect that the multi-layer substrate is liable to be deformed.

SUMMARY OF THE INVENTION

An object of the present invention is to provide a glass ceramics dielectric material which can be fired at a temperature of 1,000° C. or lower, has a low dielectric loss at a high frequency of 0.1 GHz or higher and can be co-fired along with a silver conductor without deforming a multi-layer substrate.

Another object of the present invention is to provide a sintering product thereof.

Another object of the present invention is to microwave circuit component material using the same.

These and other objects of the present invention have been accomplished by a glass ceramics dielectric material, comprising:
  a crystallizable glass powder in an amount of from 40% to 100% by mass; and
  a ceramics powder in an amount of from 0% to 60% by mass,
  wherein said crystallizable glass powder comprises:
    $SiO_2$ in an amount of from 35% to 65% by mass;
    CaO in an amount of from 10% to 30% by mass;
    MgO in an amount of from 10% to 20% by mass; and
    ZnO in an amount of from 0.5% to 35% by mass, and
  wherein said material is capable of forming:
    diopside, $CaMgSi_2O_6$, as crystals; and
    at least one of hardystonite, $Ca_2ZnSi_2O_7$, and willemite, $Zn_2SiO_4$, as crystals.

Furthermore, these and other objects of the present invention have been accomplished by sintered glass ceramics comprising:
  diopside, $CaMgSi_2O_6$, as crystals; and
  at least one of hardystonite, $Ca_2ZnSi_2O_7$, and willemite, $Zn_2SiO_4$, as crystals.

Furthermore, these and other objects of the present invention have been accomplished by sintered glass ceramics comprising:
  diOpside, $CaMgSi_2O_6$, as crystals; and
  at least one of hardystonite, $Ca_2ZnSi_2O_7$, and willemite, $Zn_2SiO_4$, as crystals.

DETAILED DESCRIPTION OF HE INVENTION

The inventors made various experiments. As a result, it was found that the above objects of the invention can be accomplished by using a crystallizable glass powder containing $SiO_2$, CaO, MgO and ZnO as main components in a predetermined amount. The present invention has thus been accomplished.

Unless otherwise indicated, the term "%" hereinafter means "% by mass" based on the total amount of the glass.

The expression "an amount of from 0 to X%" in component Y of the glass means that component Y is either not present, or is higher than 0% and X% or lower.

The reason why the formulation of the crystallizable glass powder of the invention is restricted as mentioned above will be described hereinafter.

$SiO_2$ is a glass network former as well as a constituent of diopside, hardystonite and willemite crystals. The amount of $SiO_2$ is from 35% to 65%, preferably from 40% to 55%, more preferably from 42% to 48%. When the content of $SiO_2$ is lower than 35%, the resulting composition is not vitrified. On the other hand, when the content of $SiO_2$ exceeds 65%, the resulting composition cannot be fired at 1,000° C. or less so that Ag or Cu cannot be used as a conductor or electrode.

CaO is a constituent of diopside and hardystonite crystals. The amount of CaO is from 10% to 30%, preferably from 15% to 25%, more preferably from 18% to 23%. When the amount of CaO is lower than 10%, these crystals can be hardly crystallized to thereby increase the dielectric loss. On the other hand, when the amount of CaO exceeds 30%, the resulting composition is not vitrified.

MgO is a constituent of diopside crystals. The amount of MgO is from 10% to 20%, preferably from 12% to 17%, more preferably from 14% to 16%. When the amount of MgO is lower than 10%, the crystals can be hardly crystallized. On the other hand, when the amount of MgO exceeds 20%, the resulting composition undergoes no vitrification.

ZnO is a component for lowering the shrinkage starting temperature as well as a constituent of hardestnite and willemite crystals. The amount of ZnO is from 0.5% to 35%, preferably from 15% to 30%, more preferably from 17% to 20%. When the amount of ZnO is lower than 0.5%, an effect of lowering the shrinkage starting temperature cannot be obtained. On the other hand, when the amount of ZnO exceeds 35%, the denseness of the resulting sintered product is lost.

The glass ceramics dielectric material of the invention may contain other components besides the above components, so far as desired properties such as dielectric loss and the like cannot be lost.

The glass ceramics dielectric material of the invention may be formed by the crystallizable glass powder having the above formulation alone. For the purpose of improving properties such as flexural strength, toughness and the like, the crystallizable glass powder may be used in combination with a ceramics powder. The amount of the ceramics powder to be used is 60% or less, preferably 50% or less. The reason why the proportion of the ceramics powder is thus restricted is that when the proportion of the ceramics powder exceeds 60%, the resulting composition cannot be densified.

Examples of the ceramics powder include a ceramics powder having a dielectric loss of $10 \times 10^{-4}$ or less at a frequency of from 0.1 to 10 GHz such as alumina, mullite, cristobalite, forsterite, enstatite, gahnite and the like. When a ceramics powder having a dielectric loss of greater than $10 \times 10^{-4}$ at a frequency of from 1 to 10 GHz is used, it is not preferred because the dielectric loss of the glass ceramics is increased.

When sintered, the glass ceramics dielectric material having the above formulation of the invention forms a sintered product having a dielectric constant of from 6 to 9 and a dielectric loss of $10 \times 10^{-4}$ or lower at a high frequency of 0.1 GHz or higher.

A process for the preparation of the foregoing sintered product of the invention will be described hereinafter.

Predetermined amount of a binder, a plasticizer and a solvent are added to a crystallizable glass powder or a mixture of a crystallizable glass powder and a ceramics powder to prepare a slurry. Examples of the binder include a polyvinyl butyral resin, methacrylic resin and the like Examples of the plasticizer include dibutyl phthalate and the like. Examples of the solvent include toluene, methyl ethyl ketone and the like.

Subsequently, the above slurry is formed to a green sheet according to a doctor blade method. Thereafter, the green sheet is dried, cut into a predetermined size, and then mechanically processed to form through-holes therein. A low resistivity metallic material is then printed on the surface of the through-holes and the green sheet to form a conductor or an electrode. A plurality of these green sheets are then laminated and integrated under heating.

The laminated green sheet is then fired to obtain a sintered product.

The process for the preparation of a sintered product has been described with reference to the use of green sheet, but the present invention is not limited thereto. Various processes which are commonly used in the preparation of ceramics can be employed.

Since the glass ceramics dielectric material of the invention contains ZnO in glass, a shrinkage starting temperature is lowered so that the substrate is not deformed even when co-fired along with a silver conductor. When the glass ceramics dielectric material is fixed, at least one of hardystonite $Ca_2ZnSi_2O_7$ and willemite $(Zn_2SiO_4)$ is crystallized besides diopside $(CaMgSi_2O_6)$. Since these crystals have a low dielectric loss, the resulting sintered glass ceramics also has a low dielectric loss at a high frequency of 0.1 GHz or higher.

The glass ceramics dielectric material of the invention can be fired at a low temperature of 1,000° C. or lower. Also, since it shows a shrinkage starting temperature close to that of silver conductor, the substrate is not deformed when co-fired along with silver conductor. Furthermore, since the glass ceramics dielectric material of the invention shows a low dielectric loss at a high frequency of 0.1 GHz or higher and a high mechanical strength, it can be used as a microwave circuit component.

The microwave circuit component material of the present invention may be formed the ordinal manner. For example, loading the chip such as Si-type chip or GaAs-type chip, using adhesives etc.

The glass ceramics dielectric material of the invention will be further described hereinafter in the following examples.

Tables 1 and 2 show examples of the invention (Sample Nos. 1 to 5) and a comparative example (Sample No. 6).

TABLE 1

|  | Example | | |
| --- | --- | --- | --- |
|  | Sample No.1 | Sample No. 2 | Sample No. 3 |
| Formulation of glass (% by mass) | | | |
| $SiO_2$ | 48 | 40 | 58 |
| CaO | 28 | 19 | 22 |
| MgO | 19 | 13 | 17 |
| ZnO | 5 | 28 | 1 |
| SrO | — | — | 2 |
| ZrO | — | — | — |
| $TiO_2$ | — | — | — |
| Kind of ceramics powder | — | Alumina | Mullite |
| Content (% by mass) | — | 50 | 20 |
| Firing temperature (° C.) | 850 | 900 | 880 |
| Shrinkage starting temperature (° C.) | 680 | 650 | 690 |
| Kind of crystals fired | Diopside, willemite | Diopside, willemite, hardystonite | Diopside, hardystonite |
| Dielectric constant | 7.3 | 8.5 | 8.2 |
| Dielectric loss ($\times 10^{-4}$ KgF) | 5 | 3 | 6 |
| Flexural strength (kg/cm$^2$) | 2,000 | 2,600 | 2,000 |
| Substrate deformation | B | A | B |

TABLE 2

|  | Example | | Comparative Example |
| --- | --- | --- | --- |
|  | Sample No.4 | Sample No. 5 | Sample No. 6 |
| Formulation of glass (% by mass) | | | |
| $SiO_2$ | 37 | 42 | 50 |
| CaO | 25 | 24 | 30 |
| MgO | 11 | 12 | 20 |
| ZnO | 25 | 20 | — |
| SrO | — | — | — |
| ZrO | 2 | — | — |
| $TiO_2$ | — | 2 | — |
| Kind of ceramics powder | Cristobalite | Forsterite | Alumina |
| Content (% by mass) | 10 | 35 | 40 |
| Firing temperature (° C.) | 900 | 870 | 900 |
| Shrinkage starting temperature (° C.) | 660 | 660 | 750 |
| Kind of crystals fired | Diopside, willemite, hardystonite | Diopside, willemite, hardystonite | Diopside |
| Dielectric constant | 7.0 | 7.4 | 7.8 |
| Dielectric loss ($\times 10^{-4}$ KgF) | 9 | 7 | 8 |

TABLE 2-continued

|  | Example | | Comparative Example |
| --- | --- | --- | --- |
|  | Sample No.4 | Sample No. 5 | Sample No. 6 |
| Flexural strength (kg/cm$^2$) | 2,100 | 2,200 | 2,000 |
| Substrate deformation | A | A | C |

The various samples were prepared as follows.

Glass materials were prepared according to the formulation set forth in Tables above, melted at a temperature of from 1,400° C. to 1,500° C. in a platinum crucible for 3 to 6 hours, and then subjected to a water-cooled rollers to form a thin plate Subsequently, these formed materials were milled in alcohol by a ball mill to form a crystallizable glass powder having an average particle diameter of from 1.5 to 3 μm. For Sample Nos. 2 to 6, ceramics powders (average particle diameter: 2 μm) set forth in Tables above were added to obtain mixed powder.

The firing temperature, shrinkage starting temperature, crystallized crystal, dielectric constant, dielectric loss and flexural strength in the samples thus obtained were then measured. These samples were also examined to see if they are deformed when co-fired along with a silver conductor. The results are set forth in Tables above.

As is apparent from Tables above, the samples of the examples of the invention can be fired at a low temperature of from 850° C. to 900° C. After firing, at least one of hardestnite and willemite crystals was crystallized besides diopside crystals. These samples were also found to have a dielectric constant of from 7.0 to 8.5 and a dielectric loss of from 3 to 9×10$^{-4}$ at a frequency of 2.4 GHz. Additionally, the flexural strength was as high as 2,000 kg/cm$^2$ or more. On the other hand, Since Sample No. 6 as a comparative example was free of ZnO and had a high shrinkage starting temperature, the substrate was deformed when co-fired along with a silver conductor.

The firing temperature set forth in Tables above shows the lowest value in the firing temperatures of the fired samples on which ink applied did not remain when wiped (densely sintered samples). The shrinkage starting temperature was measured by applying the pressure-bonded laminate of green sheets to a M meter and measuring a shrinkage curve. For the analysis of crystallized phase, the sample was fired at the temperature set forth in Tables above, and then subjected to X-ray analysis. The dielectric constant and dielectric loss were measured using the fired sample with a cavity resonator (measuring frequency: 2.4 GHz) at 25° C. The flexural strength was measured according to a three-point load measurement method by forming the fired sample into a plate pile having a size of 10 mm×40 mm×1 mm. The deformation of substrate was judged by applying a silver paste to the pressure-bonded laminate of green sheets, firing them at the temperature set forth in Tables above and confirming the presence or absence of deformation of the substrate by the visual inspection.

In Tables, A represent that "no deformation", B represent "slight deformation", and C represent "obvious deformation".

While the invention has been described in detail and with reference to specific embodiments thereof, it will be apparent to one skilled in the art that various changes and modifications can be made therein without departing from the spirit and scope thereof.

This application is based on Japanese Patent application No. 2000-351485 filed on Nov. 17, 2000, the entire contents of which are incorporated hereinto by reference.

What is claimed is:

1. A sintered glass ceramics, comprising:

diopside, CaMgSi$_2$O$_6$, as crystals; and
at least one of hardystonite, Ca$_2$ZnSi$_2$O$_7$, and willemite, Zn$_2$SiO$_4$, as crystals.

2. A microwave circuit component material, comprising diopside, CaMgSi$_2$O$_6$, as crystals; at least one of hardystonite, Ca$_2$ZnSi$_2$O$_7$, and willemite, Zn$_2$SiO$_4$, as crystals.

* * * * *